United States Patent [19]

Volz et al.

[11] Patent Number: 5,486,771
[45] Date of Patent: Jan. 23, 1996

[54] BURN-IN SOCKET TESTING APPARATUS

[75] Inventors: Keith L. Volz, Jamestown; Robert M. Renn, Pfafftown; Robert D. Irlbeck, Greensboro; Frederick R. Deak, Kernersville; David C. Johnson, Winston-Salem, all of N.C.

[73] Assignee: Whitaker Corporation, Wilmington, Del.

[21] Appl. No.: 363,559

[22] Filed: Dec. 23, 1994

Related U.S. Application Data

[63] Continuation of Ser. No. 81,769, Jun. 23, 1993, abandoned.

[51] Int. Cl.6 .............................. G01R 31/02; H05K 1/02
[52] U.S. Cl. ................................ 324/755; 439/70
[58] Field of Search ...................... 324/754–755, 324/756, 757, 758, 760, 761, 762, 763; 439/70, 71, 72, 73, 330–333

[56] References Cited

U.S. PATENT DOCUMENTS 4,498,047  2/1985  Hexamer et al. ................. 324/754
4,779,047  10/1988  Solstad et al. .................... 324/158
5,100,332  3/1992  Egawa ............................. 439/72
5,120,238  6/1992  Marks et al. ..................... 439/331

*Primary Examiner*—Kenneth A. Wieder
*Assistant Examiner*—Barry C. Bowser
*Attorney, Agent, or Firm*—Timothy J. Aberle

[57] ABSTRACT

This invention is directed to a mechanical, robotically operated burn-in socket testing apparatus for integrated circuit "chips", where such chips, as known in the art, are typically planar electronic devices. The apparatus, operationally mounted to a planar electronic board, such as a mother board, comprises a first frame member for mounting to the mother board, where the first frame member includes electrical means for engaging chip leads and applying electrical current thereto during the burn-in testing. A second frame member is disposed in sliding engagement with the first frame member, where the second frame member is movable from a first position to a second position. Finally, cooperative latching and camming means are provided between the first and second frame members to effect the movement between the first and second positions, and to securely hold the chip during burn-in, where the camming means includes a pivotal member movable from a remote position free of the chip to a position engaging the chip.

21 Claims, 6 Drawing Sheets

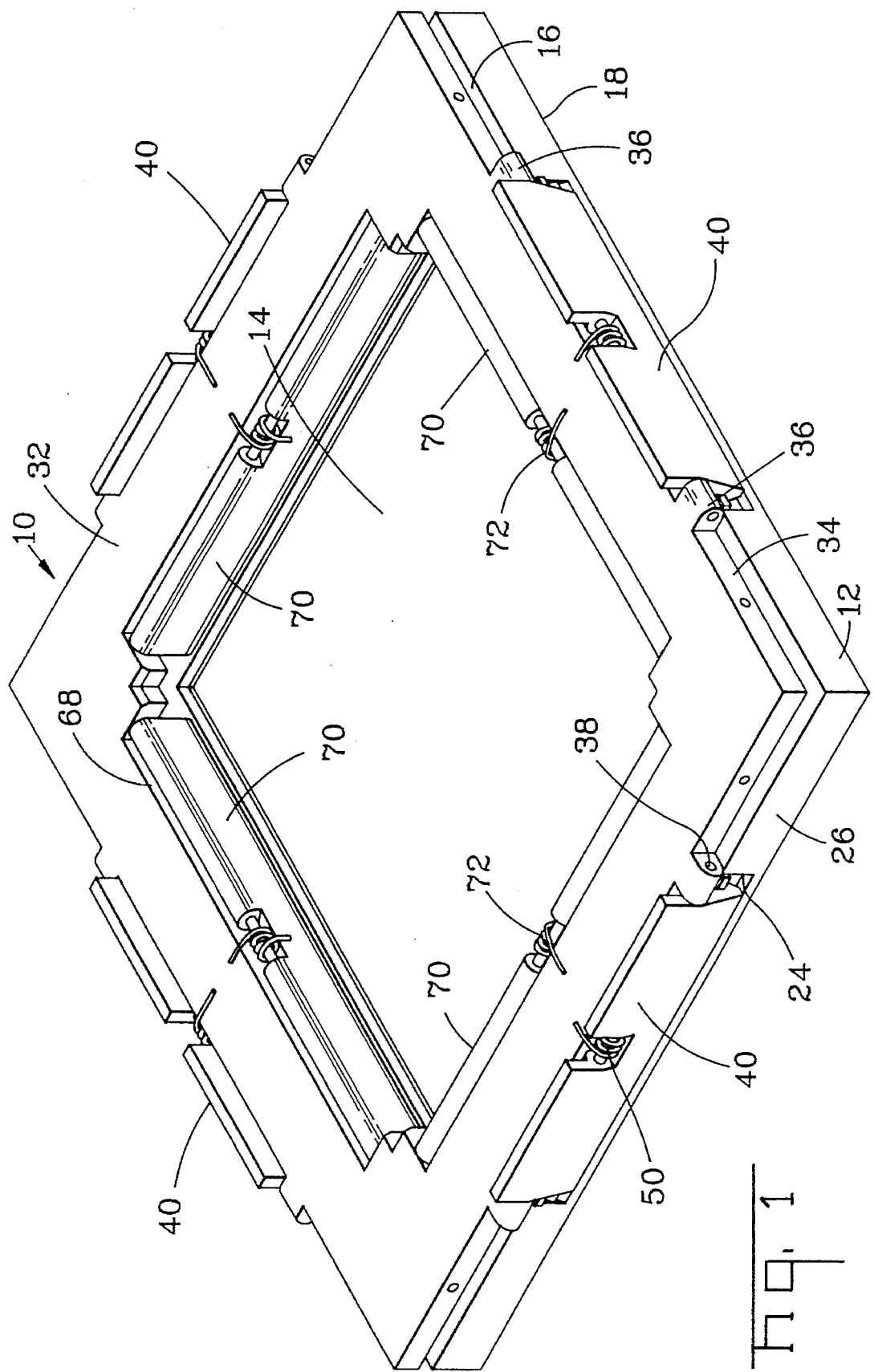

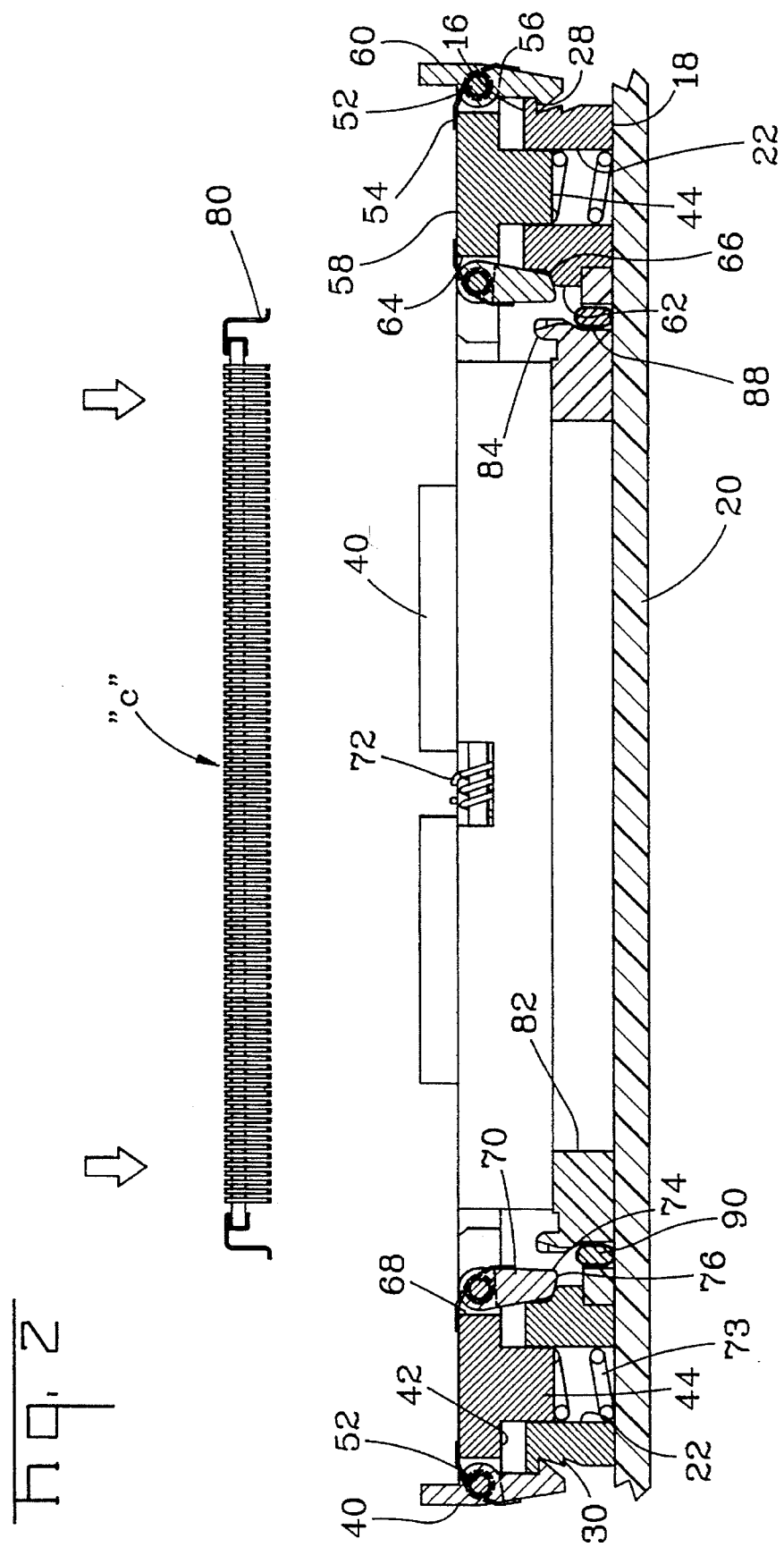

BURN-IN SOCKET TESTING APPARATUS

This application is a Continuation of application Ser. No. 08/081,769 filed Jun. 23, 1993, now abandoned.

RELATED APPLICATION

The present invention relates to burn-in socket testing apparatus for integrated circuit "chips", and represents an improvement to the invention disclosed and claimed in U.S. Ser. No. 07/975,350, filed Nov. 12, 1992, now U.S. Pat. No. 5,273,441, granted Dec. 28, 1993, and assigned to the assignee hereof.

BACKGROUND OF THE INVENTION

Experience has shown that the catastrophic failure of an integrated circuit chip, such as a microprocessor, will typically occur during the initial phase of the chip life. If the chip passes its initial operational phase, the life and reliability of the chip will have a relatively high probability.

To precipitate early chip failure, the chip is "exercised" or powered while being subjected to relatively high external temperatures. Typically, a batch of chips is electrically powered in an oven where the temperature is maintained at approximately 150° C. for an extended period of time, such as 1,000 hours. This is referred to in the art as "burn-in".

During burn-in, a batch of chips may be mounted on a mother board, and the chip leads are electrically connected to respective circuit elements on the mother board by a suitable means, such as one or more flexible electrical connectors. Maintaining good electrical contact between the chip leads and the flexible electrical connector is very important. Where the leads are made of gold, the electrical contact is usually not a major problem; but where the chip leads are tin plated, a relatively high retention force is necessary to assure good electrical contact. This is due to oxidation of the tin-plated chip leads. Even if the oven has a nitrogen atmosphere, it is still necessary to maintain a relatively-high clamping force to retain the chip frames and assure good electrical contact with the chip leads.

In order to assure a proper and sufficient retention force, especially where the chip leads are tin-plated, a system of levers or oversized latches are usually necessary in order to achieve the necessary mechanical advantage for the desired retention force. However, because of space problems, this is not feasible nor particularly desirable since it reduces the total number of chips on the board and thus reduces production rates.

For large batches of chips, the testing apparatus is fully automated and includes robotics arms for transferring the batches of chips into and out of the oven. In production, and because of the relatively large number of chips being burned-in, the prior clamping mechanisms interfered with the high-speed automated apparatus for transferring large batches of chips.

The co-pending and related application noted earlier represents an approach to overcome the problems associated with prior art procedures, particularly the clamping mechanisms. Such application teaches the use of a thermally-reactive resilient member, which as known in the art as a shape memory alloy (SMA). Briefly, such an alloy undergoes a dimensional change, through a crystalline or phase transformation, when subjected to a temperature increase. As part of the clamping mechanism, the SMA resilient means provides a relatively low force at ambient temperatures and a relatively high force at high temperatures, such that the clamping mechanism retains the chip frame, while maintaining good electrical contact between the electrical means and the chip leads during burn-in.

While the system of the co-pending application represents an effective manner to successfully test "chips", it does not have the full versatility of the present invention which avoids the use of SMA's, and is fully amenable to robotics handling. These and other features will become apparent in the description which follows, particularly when read in conjunction with the accompanying drawings.

SUMMARY OF THE INVENTION

The present invention is directed to a burn-in socket testing apparatus for integrated circuit chips, where said chips are planar electronic devices, having leads or leadless, such as circuit traces or pads thereon, as known in the art. The apparatus, typically mounted on a planar electronic board, such as a mother board, includes electrical interconnection means for applying an electrical current to the chip during burn-in, a process during which the apparatus and chip are subjected to a temperature of about 150° C. for a prolonged period. The apparatus comprises a first frame member for mounting to the planar electronic board, i.e. mother board, where first frame member includes electrical means for engaging the chip leads or traces and applying electrical current during burn-in. Above the first frame member is a second frame member disposed in sliding engagement therewith, where the second frame member is movable from a first position to a second position. Finally, cooperative latching and camming means are provided between the first and second frame members to effect the movement between the first and second positions, and to securely hold the chip during burn-in, where the canning means includes a pivotal member movable from a remote position free of the chip to a position engaging the chip.

BRIEF DESCRIPTION OF DRAWINGS

FIG. 1 is a top perspective view of a burn-in socket testing apparatus according to the present invention, less the "chip" to be tested therein.

FIG. 2 is a sectional view of the apparatus of FIG. 1, showing the "chip" in a pre-insertion position.

FIG. 3 is an enlarged, partial perspective view of one corner of a compression member carrying the "chip", further illustrating the combination means for aligning the leads of a "chip" to be burned-in according to the invention hereof.

DETAILED DESCRIPTION OF PREFERRED EMBODIMENTS

Figure 7:
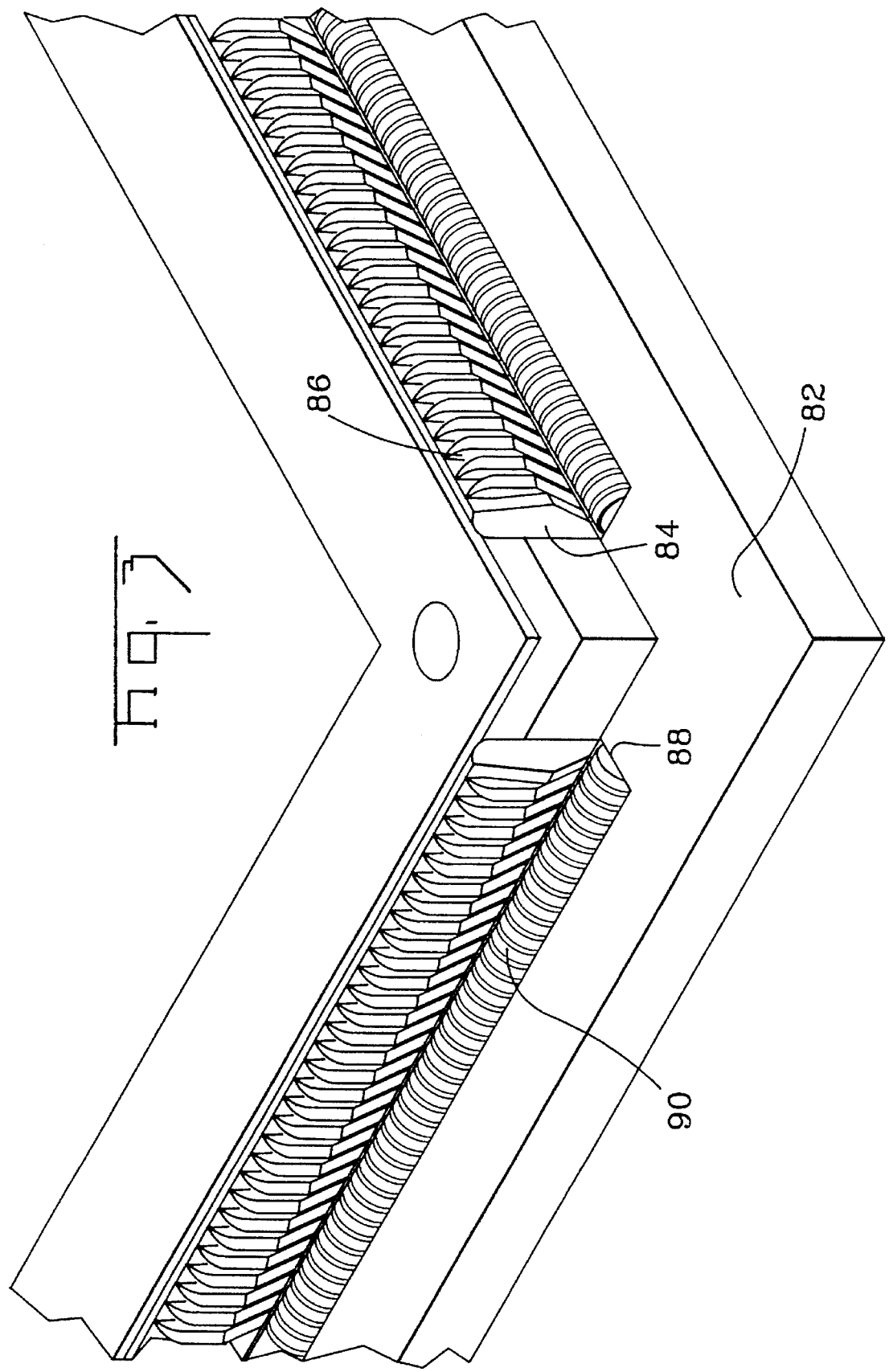
FIGS. 4–7 are partial, sectional views of the apparatus of FIG. 1, showing sequentially the "chip" loading into the apparatus of this invention.

The invention hereof is directed to a burn-in testing apparatus of the type for testing integrated circuit "chips", typically at temperatures up to 150° C. for extended periods of time.

The preferred apparatus or burn-in socket 10, as best illustrated in FIGS. 1 to 3, comprises a generally rectangular frame member 12 having a central opening 14 therein for receiving the chip "C", see FIG. 2, where the frame member 12 includes a planar top surface 16, and a planar bottom surface 18, which as herein noted lies contiguous with and is secured to a "mother" board 20. In the respective four corners of the frame member 12, through holes 22, i.e. between top and bottom surfaces 16, 18, are provided. Finally, recesses 24, one of each in the four side walls 26 of frame member 12, are included, where such recess is provided with an upper lip 28 and an intermediate toothed flange 30, and the vertical distance between said lip 28 and said flange 30 defines the depth of movement of the overlying ring like frame member 32, relative to the frame member 12, as hereinafter explained.

Disposed above, and arranged in sliding engagement with the frame member 12, is ring like frame member 32, the dimensions of which are essentially coextensive with the frame member 12. Projecting laterally from the respective sides 34 of ring like frame member 32, are pairs of pivot arms 36 which contain pins 38 for pivotally mounting latching pawls 40. As best seen in FIG. 2, the lower surface 42 of ring like frame member 32, at the respective corners thereof in alignment with the holes 22, is provided with posts 44, where each such post is slidably received in a corresponding hole 22.

Mounted within each latching pawl 40 is a torsion spring 50, about pin 52, where the ends 54, 56 thereof are arranged to lie against the top surface 58 of the ring-like frame member 32 and side wall 60 of latching pawl 40, respectively.

The inner walls 62 and 64 of the frame member 12 and ring-like frame member 32, respectively, include cooperative engagement means. For the preferred embodiment, as best illustrated in the chip loading sequence of FIGS. 4 to 7, the inner wall 62 includes a camming surface step 66. The inner wall 62 includes a recess 68, essentially one recess along each inner wall portion, within which is pivotally mounted a chip pusher member 70. Each pusher member 70 includes a centrally disposed torsion spring 72 positioned and arranged to return the pusher member 70 to its normal or resiled positioned (FIG. 4) when the tested chip is to be removed from the apparatus. To effect return of the ring-like frame member 32 to its preloading position, a compression spring 73 is positioned within each hole 22 to act against a respective post 44. Finally, the pusher member 70, along its lower or remote edge 74, is tapered 76 to facilitate its movement along camming surface 66, as the posts 44 vertically move within holes 22.

Retaining now to FIG. 2, the chip "C" typically includes plural leads 80 disposed about the chip periphery. Within the central opening 14 a base or chip pedestal 82 is included to receive the chip "C" during burn-in. As best seen in FIG. 3, the base 82 includes an upstanding projection 84 containing plural teeth or grooves 86 to align the chip leads 80 as the chip "C" is positioned upon the base 82. Mounted within the base 82, along through slots 88, is flexible film 90, wrapped about an elastomeric member, as known in the art, where such flexible film 90 includes electrical circuit traces corresponding to the leads 80, whereby electrical interconnection may be effected between the chip "C" and mother board 20 during burn-in.

Figure 8:
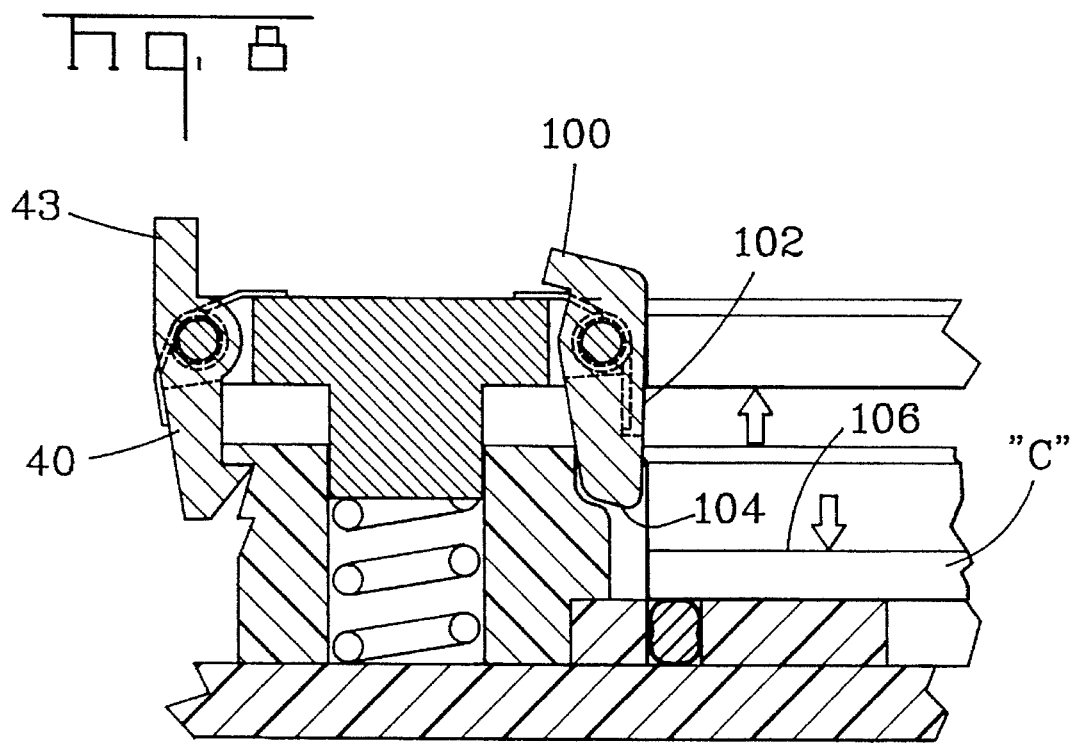
FIG. 8 and 9 are partial, sectional views similar to FIGS. 5 and 7 showing an alternate embodiment for the burn-in testing of leadless "chips".
Figure 9:
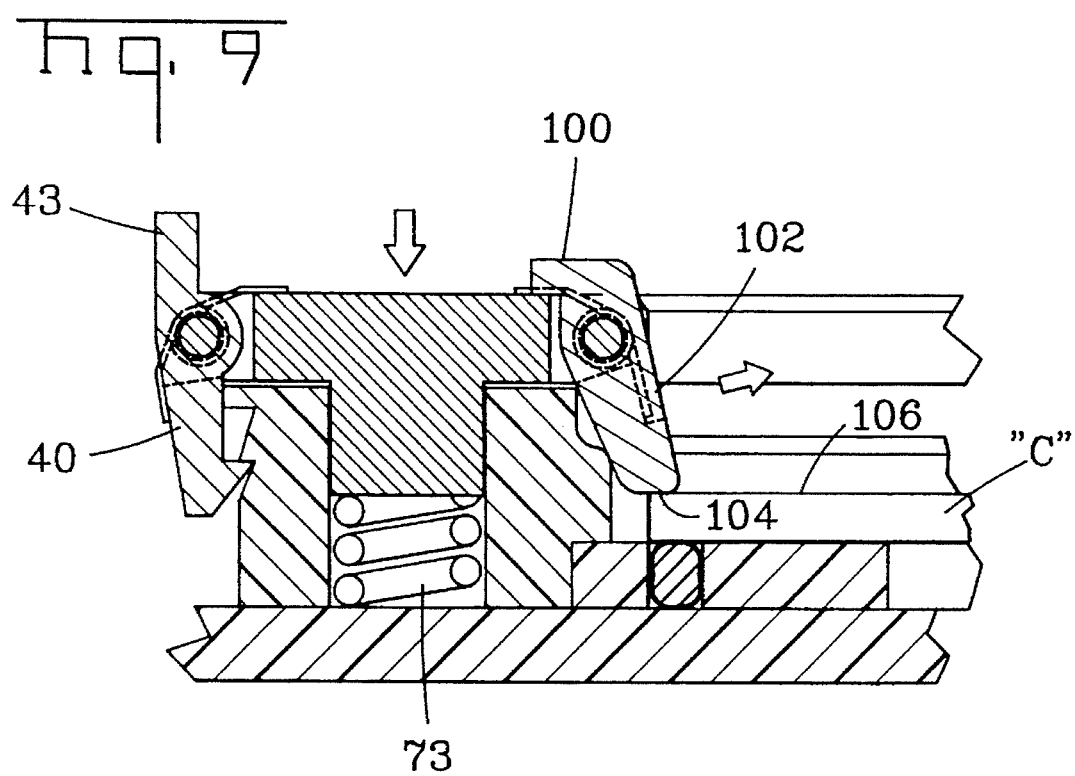

FIGS. 8 and 9 represent an alternate embodiment, where the chip "C" is leadless, as known in the art. That is, the apparatus hereof is quite versatile in handling both types of chips under conditions of total robotic handling for loading and unloading of the selected type of chip. In any case, for such leadless chips, the apparatus has been modified by the inclusion of the angled leg 100 extending from the upper end of pusher member 102. It will be seen, particularly in FIG. 9, that such leg acts to limit the rotational action of pusher member 102. In this embodiment, the tapered cam rider surface 104 moves to a position to overlie and contact the upper surface 106 of chip "C", where the several pusher members 102 exert a uniform, normal force against the chip, about the chip periphery thereof during testing.

Figure 4:
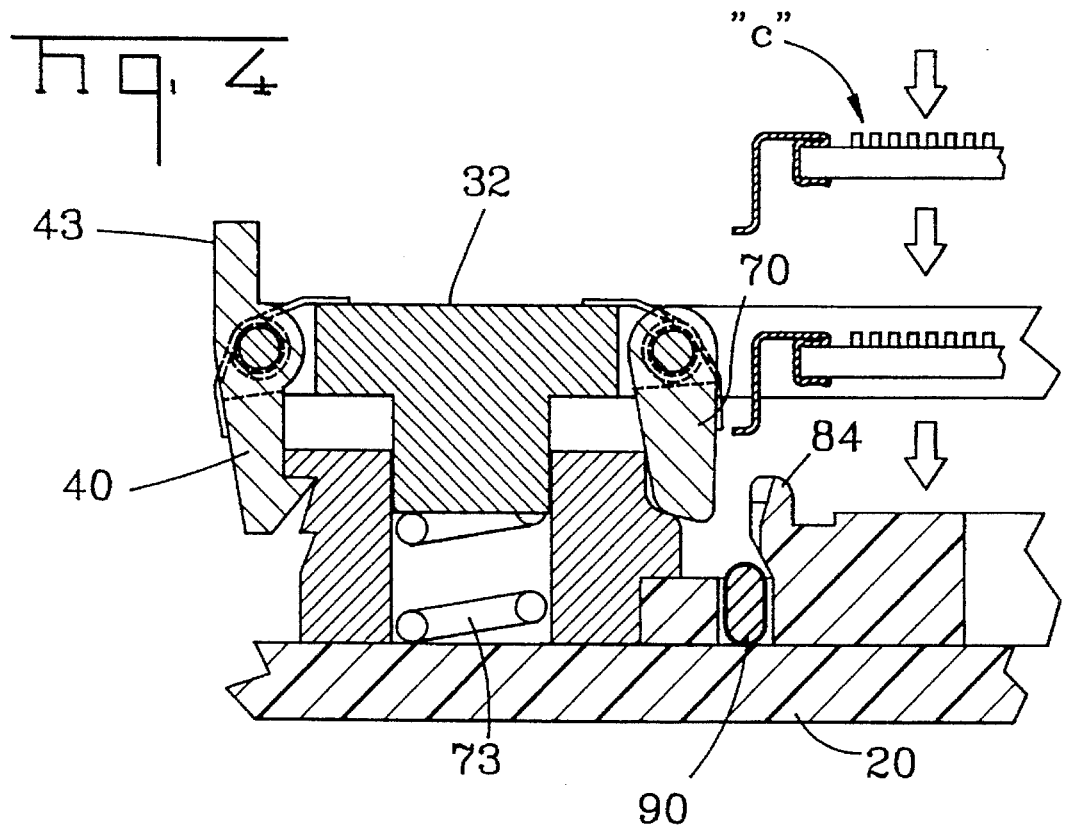
Figure 5:
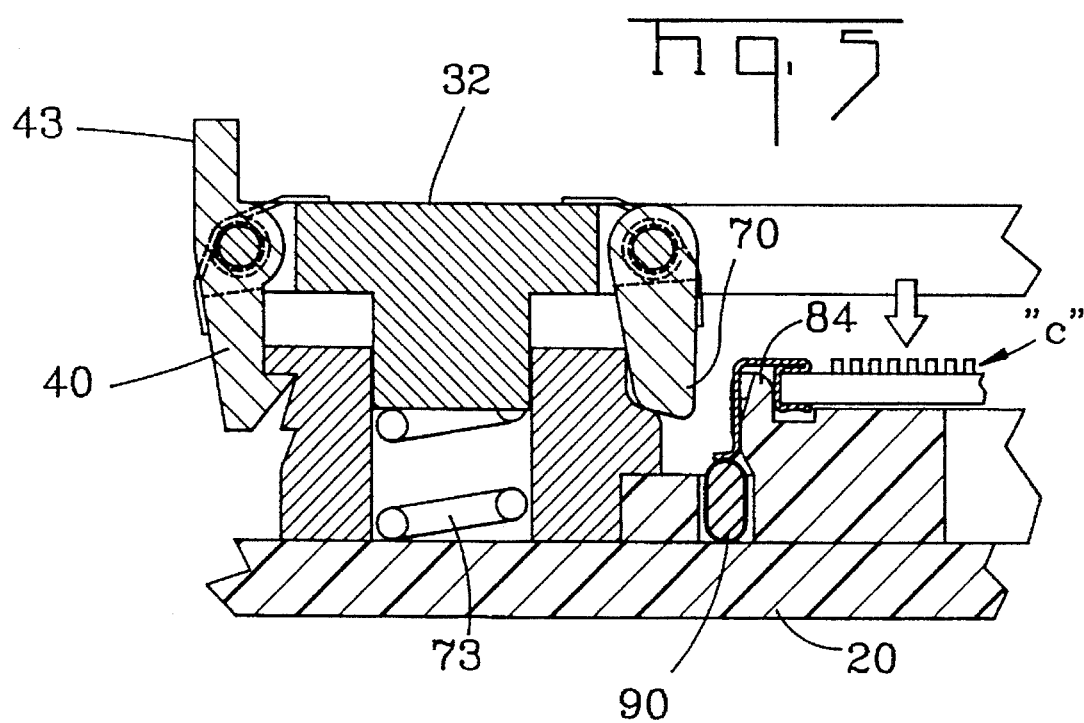
Figure 6:
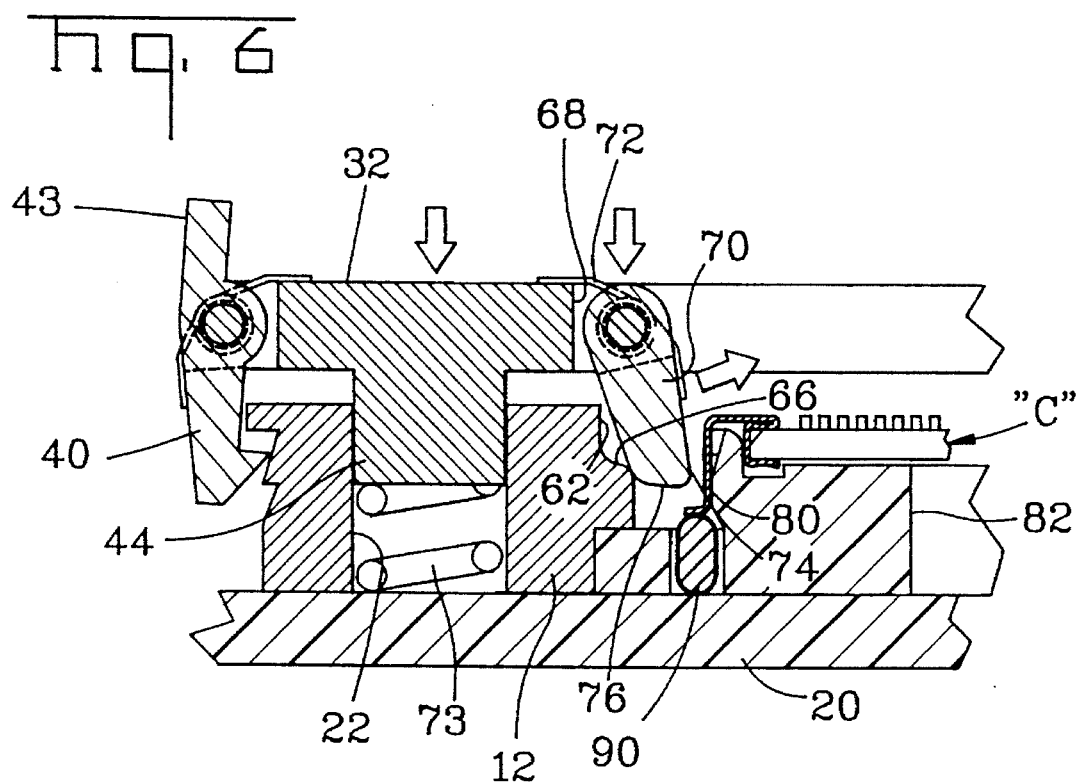
Figure 7:
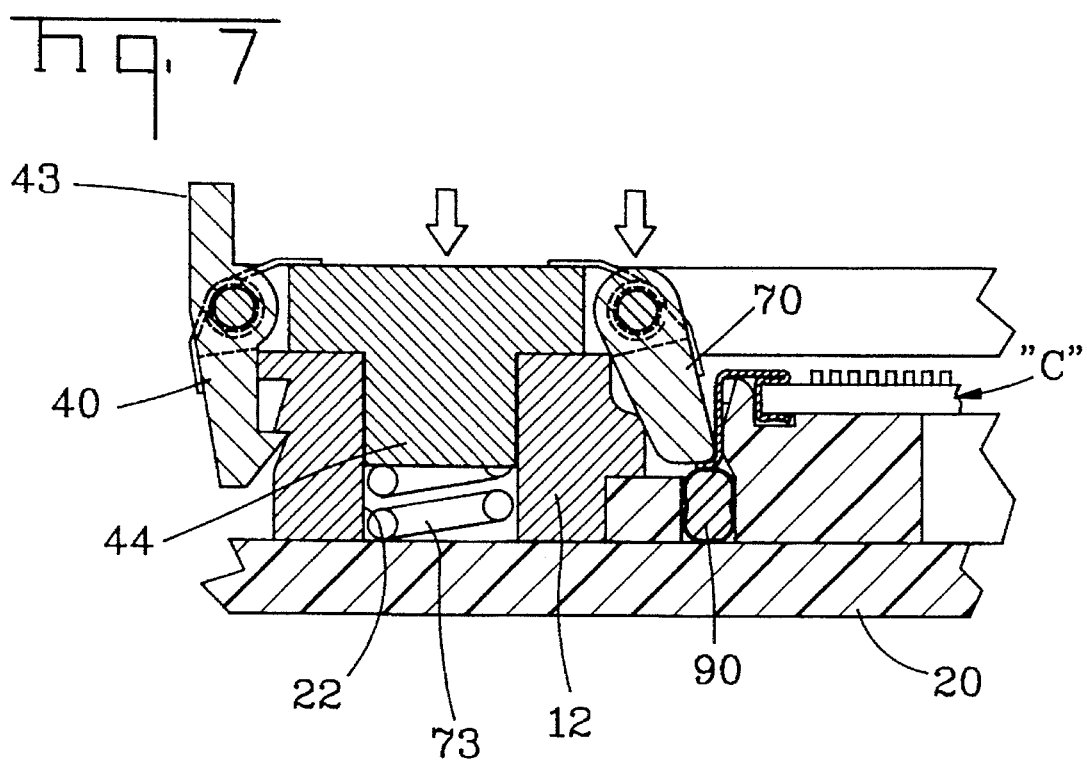

The operation of the apparatus, especially the ease by which the burn-in socket of this invention may be robotically handled, may best be illustrated by first observing the preloading stage depicted in FIGS. 4 or 5, and FIG. 8. In these respective Figures, it will be seen that the base or pedestal upon which the chip is to be positioned is open to top loading. That is, there is no maneuvering about any clamping arms. After positioning the chip "C", a normal force, see the direction arrows in FIGS. 6, 7 and 9, is applied to the ring-like frame member 12. Concurrent with this action, the latching pawl 40 is caused to move along the tapered surface 41 until it reaches the flange 30 and resiles in locking engagement therewith, and the pusher member 40 begins to pivot inwardly while riding the camming surface 66. When the respective frame members lie contiguous, it will be seen that the pusher members 40 are positioned to apply a uniform, normal force to the contained chip. After testing, a lateral force may be applied to the upper arms 43 of latching pawls 40, thereby releasing the pawls from contact with flange 30. Once released, the compression spring 73 acts to return the ring-like frame member 32 to its preloading position, i.e. spaced apart from frame member 12, to fully expose the chip for easy removal from the apparatus.

We claim:

1. A burn-in socket testing apparatus for use with an integrated circuit chip, said apparatus includes electrical contact surfaces for electrical engagement with electrical contact surfaces formed on said chip, said apparatus comprising:

a first frame member having a first pusher member and a second pusher member, each said pusher member is pivotally mounted to said first frame member for independent pivotal motion relative to said first frame member;

a second frame member operatively connected to said first frame member for relative movement therebetween, said first and second frame members being adapted to cause pivotal movement in said pusher members during said relative movement, and the second frame member includes at least one camming surface which is adapted to engage one of said pusher members during said relative movement.

2. The burn-in socket testing apparatus of claim 1, wherein at least one of said pusher members acts as a cam follower during said pivotal motion in response to engaging said camming surface formed on said second frame member.

3. The burn-in socket testing apparatus of claim 1, wherein the first frame member is ring-like in shape with a hollow median portion.

4. The burn-in socket testing apparatus of claim 1, wherein the first frame member includes at least one post which is adapted to reciprocate within an aperture formed in said second frame member during said relative movement.

5. The burn-in socket testing apparatus of claim 1, wherein at least a portion of said first frame member includes a pair of pins for pivotably mounting a pawl and a pusher member.

6. The electrical testing apparatus of claim 1, wherein said first frame member comprises at least a pair of opposing sides, wherein each opposing side includes a latching pawl.

7. The electrical testing apparatus of claim 1, wherein said first frame member comprises at least a pair of opposing sides, wherein each opposing side has a respective pusher member disposed thereon.

8. A burn-in socket testing apparatus for use with an integrated circuit chip, said apparatus includes electrical contact surfaces for electrical engagement with electrical traces on said chip, said apparatus comprising:

a first frame member having a first pusher member and a second pusher member, each said pusher member is pivotally mounted to said first frame member for independent pivotal motion relative to said first frame member, and said first frame member comprises at least a pair of opposing sides, each opposing side includes a latching pawl; and a second frame member operatively connected to said first frame member for relative movement therebetween, said first and second frame members being adapted to cause pivotal movement in said pusher members during said relative movement.

9. The burn-in socket testing apparatus of claim 8, wherein at least one of said pusher members acts as a cam follower during said pivotal motion in response to engaging a camming surface formed on said second frame member.

10. The burn-in socket testing apparatus of claim 8, wherein the second frame member includes at least one camming surface which is adapted to engage one of said pusher members during said relative movement.

11. The burn-in socket testing apparatus of claim 8, wherein the first frame member is ring-like in shape with a hollow median portion.

12. The burn-in socket testing apparatus of claim 8, wherein the first frame member includes at least one post which is adapted to reciprocate within an aperture formed in said second frame member during said relative movement.

13. The burn-in socket testing apparatus of claim 8, wherein at least a portion of said first frame member includes a pair of pins for pivotably mounting at least one of said pawls and at least one of said pusher members.

14. The electrical testing apparatus of claim 8, wherein said opposing sides each have a respective pusher member disposed thereon.

15. A burn-in socket testing apparats for use with an integrated circuit chip, said apparatus includes electrical contact surfaces for electrical engagement with electrical contact surfaces on said chip, said apparatus comprising:

a first frame member having a first pusher member and a second pusher member, each said pusher member is pivotably mounted to said first frame member for independent pivotal motion relative to said first frame member; and a second frame member operatively connected to said first frame member for relative movement therebetween, said second frame member includes an engaging surface for sliding engagement with at least one of said pusher members, and said sliding engagement causes pivotal movement in said at least one pusher member during said relative movement.

16. The burn-in socket testing apparatus of claim 15, wherein said second frame member engaging surface is a cam surface.

17. The burn-in socket testing apparatus of claim 15, wherein at least one of said pusher members is formed of a non-metallic material.

18. The burn-in socket testing apparatus of claim 15, wherein at least one of said pusher members has a pin receiving hole formed therein.

19. The burn-in socket testing apparatus of claim 15, wherein said apparatus further includes a flexible film member with circuit traces formed thereon.

20. The burn-in socket testing apparatus of claim 15, wherein said apparatus further includes at least one coil spring which is adapted to bias at least one of said pusher members.

21. The burn-in socket testing apparatus of claim 15, wherein said pusher members move relatively towards each other during said pivotal movement.

* * * * *